(12) United States Patent
Hsieh et al.

(10) Patent No.: US 12,556,174 B2
(45) Date of Patent: Feb. 17, 2026

(54) VOLTAGE SELECTOR DEVICE

(71) Applicant: REALTEK SEMICONDUCTOR CORPORATION, Hsinchu (TW)

(72) Inventors: Yu-Chen Hsieh, Hsinchu (TW); Tsung-Yen Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 8 days.

(21) Appl. No.: 18/809,399

(22) Filed: Aug. 20, 2024

(65) Prior Publication Data
US 2025/0070769 A1 Feb. 27, 2025

(30) Foreign Application Priority Data
Aug. 22, 2023 (TW) ................. 112131452

(51) Int. Cl.
*H03K 17/00* (2006.01)
*H03K 17/693* (2006.01)

(52) U.S. Cl.
CPC ......... *H03K 17/005* (2013.01); *H03K 17/693* (2013.01)

(58) Field of Classification Search
CPC .................................................. H03K 17/005
USPC ......................................................... 327/407
See application file for complete search history.

(56) References Cited

U.S. PATENT DOCUMENTS

2025/0264898 A1* 8/2025 Lee .................. H03K 19/00346

OTHER PUBLICATIONS

Analog design: max voltage selector, Aug. 21, 2015, https://www.edaboard.com/threads/analog-design-max-voltage-selector.342963/.

* cited by examiner

*Primary Examiner* — Tomi Skibinski
(74) *Attorney, Agent, or Firm* — WPAT, PC

(57) ABSTRACT

A voltage selector device includes a control circuit and a selection circuit. The control circuit is configured to adjust a level of a control node according to a power enable signal, a first supply voltage, and a second supply voltage. When the first supply voltage is powered up and the second supply voltage is not powered up, the control circuit adjusts the level of the control node to a first level, and when the second supply voltage is powered up, the control circuit adjusts the level of the control node to a second level that is different from the first level. The selection circuit is configured to output, based on the level of the control node and second supply voltage, a selected one of the first supply voltage and the second supply voltage that has a higher voltage level as an output voltage.

17 Claims, 5 Drawing Sheets

VOLTAGE SELECTOR DEVICE

BACKGROUND OF THE INVENTION

1. Field of the Invention

The present disclosure relates to a voltage selector device, especially to a voltage selector device that is able to prevent system operations from interruption.

2. Description of Related Art

In some applications, electronic devices can operate in high voltage and low voltage modes, thereby reducing power consumption in low voltage mode. To switch between high voltage and low voltage modes, such electronic devices typically have a voltage selector circuit to choose the supply voltage with the highest level for operation. However, in current technologies, this voltage selector circuit often requires the use of additional comparators, leading to extra power consumption. Moreover, some systems need to interrupt their original operations during the switch between high and low voltage modes to avoid operational errors in the circuits. As a result, these systems cannot continuously perform original operations.

SUMMARY OF THE INVENTION

In some aspects, an object of the present disclosure is to, but not limited to, provide a voltage selector device that is able to prevent system operations from interruption.

In some aspects, a voltage selector device includes a control circuit and a selection circuit. The control circuit is configured to adjust a level of a control node according to a power enable signal, a first supply voltage, and a second supply voltage. When the first supply voltage is powered up and the second supply voltage is not powered up, the control circuit adjusts the level of the control node to a first level, and when the second supply voltage is powered up, the control circuit adjusts the level of the control node to a second level that is different from the first level. The selection circuit is configured to output, based on the level of the control node and the second supply voltage, a selected one of the first supply voltage and the second supply voltage that has a higher voltage level as an output voltage.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system implemented with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, similar/identical elements in various figures are designated with the same reference number.

Figure 1:
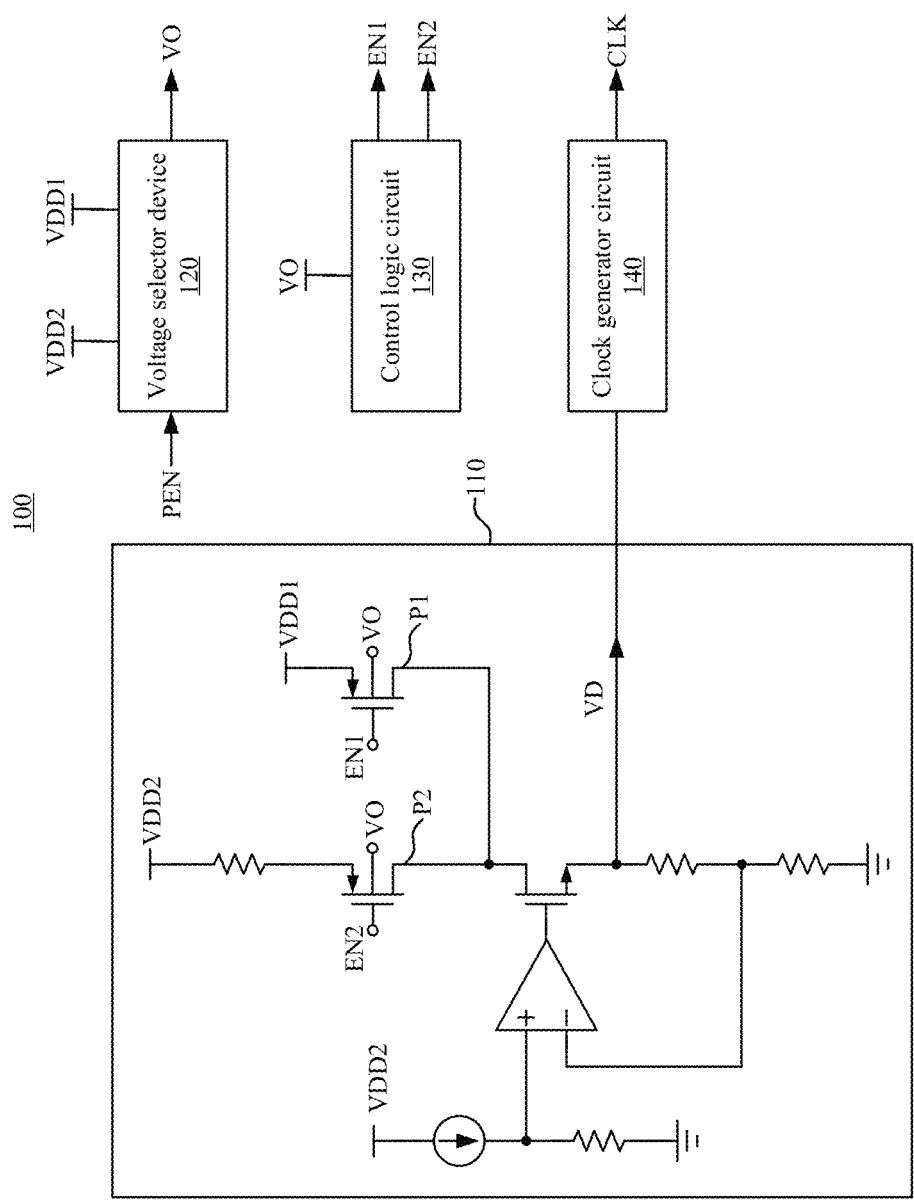
FIG. 1 illustrates a schematic diagram of an integrated circuit according to some embodiments of the present disclosure.

FIG. 1 illustrates a schematic diagram of an integrated circuit 100 according to some embodiments of the present disclosure. In some embodiments, the integrated circuit 100 may be a chip operable in a high voltage mode or a low voltage mode. For example, the integrated circuit 100 may include a low-dropout regulator circuit 110, a voltage selector device 120, a control logic circuit 130, and a clock generator circuit 140. The low-dropout regulator circuit 110 may generate a driving voltage VD according to a supply voltage VDD1 and a supply voltage VDD2, in which the low-dropout regulator circuit 110 includes a P-type transistor P1 and a P-type transistor P2. The P-type transistor P1 is selectively turned on according to an enable signal EN1 to transmit the supply voltage VDD1 to other circuits in the low-dropout regulator circuit 110 (e.g., N-type transistors, other resistors, and/or amplifier circuits in the low-dropout regulator circuit 110 of FIG. 1) to generate the driving voltage VD. The P-type transistor P2 is selectively turned on according to an enable signal EN2 to transmit the supply voltage VDD2 to other circuit components in the low-dropout regulator circuit 110 to generate the driving voltage VD. The bases of both P-type transistors P1 and P2 receive an output voltage VO from the voltage selector device 120.

The voltage selector device 120 selectively outputs one of the supply voltages VDD1 and VDD2, which currently has a higher level, as the output voltage VO according to a power enable signal PEN, the supply voltage VDD1, and the supply voltage VDD2. In greater detail, if both of the supply voltages VDD1 and VDD2 are powered up (i.e., the power sources that provide the supply voltages VDD1 and VDD2 are in a stable state and generate the supply voltages VDD1 and VDD2 with a predetermined target level), the supply voltage VDD1 is lower than the supply voltage VDD2. For example, a predetermined target level of the supply voltage VDD1 may be, but is not limited to, 1.35 volts, and the predetermined target level of the supply voltage VDD2 may be, but is not limited to, 1.5 volts. Therefore, under the condition that both supply voltages VDD1 and VDD2 are powered up, the current level of the supply voltage VDD1 (e.g., 1.35 volts) is lower than the current level of the supply voltage VDD2 (e.g., 1.5 volts). When the supply voltage VDD1 has been powered up and the supply voltage VDD2 has not yet been powered up (at this time, the supply voltage VDD2 may be 0 volts or not yet stabilized at the predetermined target level), the integrated circuit 100 operates in the low voltage mode. Under this condition, the voltage selector device 120 outputs the supply voltage VDD1 as the output voltage VO. Alternatively, when supply voltage VDD2 has been powered up, the integrated circuit 100 operates in the high voltage mode. Under this condition, the voltage selector device 120 outputs the supply voltage VDD2 as the output voltage VO. With the above operations, during the powering process of the supply voltages VDD1 and VDD2, the voltage selector device 120 may select one of the supply voltages VDD1 and VDD2, which currently has a higher level, as the output voltage VO, to provide the correct base bias for the P-type transistors P1 and P2. Detailed arrangements of the voltage selector device 120 will be given later with reference to FIG. 2.

The control logic circuit 130 is powered by the output voltage VO and outputs the enable signal EN1 or the enable signal EN2 according to the level of the output voltage VO. For example, when the level of the output voltage VO is the same as the level of the supply voltage VDD1, it indicates that supply voltage VDD1 has been powered up and the supply voltage VDD2 has not yet been powered up. Under this condition, the control logic circuit 130 outputs the enable signal EN1 having a predetermined logic value (in this example, a logic value of 0). In response to this enable signal EN1, the P-type transistor P1 is turned on to transmit the supply voltage VDD1 to other circuit components in the low-dropout regulator circuit 110, allowing the low-dropout regulator circuit 110 to continue generating the driving voltage VD. Alternatively, when the level of the output voltage VO is the same as the level of the supply voltage VDD2, it indicates that the supply voltage VDD2 has been powered up. Under this condition, the control logic circuit 130 outputs the enable signal EN2 having the predetermined logic value (in this example, a logic value of 0). In response to this enable signal EN2, the P-type transistor P2 is turned on to transmit the supply voltage VDD2 to other circuit components in the low-dropout regulator circuit 110, allowing the low-dropout regulator circuit 110 to continue generating the driving voltage VD. In some embodiments, the control logic circuit 130 may be implemented with a digital logic circuit with the functionality to determine the level of the output voltage VO.

The clock generator circuit 140 is powered by the driving voltage VD to generate a clock signal CLK. With the voltage selector device 120, it is ensured that the low-dropout regulator circuit 110 does not encounter errors during the process of switching between the supply voltages VDD1 and VDD2 (i.e., the transition from one of the high voltage mode and the low voltage mode to another one of those modes), thus continuously providing the driving voltage VD with an appropriate level. As a result, the clock generator circuit 140 may continue to generate the clock signal CLK during the aforementioned voltage switching process, in order to continuously provide a usable reference timing for other circuits in the system (not shown). In some embodiments, the clock generator circuit 140 may include, but is not limited to, a phase-locked loop circuit.

An example where the voltage selector device 120 is applied to generate clock(s) are given in FIG. 1 as an example, but the present disclosure is not limited thereto. Various applications that may employ the voltage selector device 120 to operate in the high voltage mode and the low voltage mode are with the contemplated scope of the present disclosure.

Figure 2:
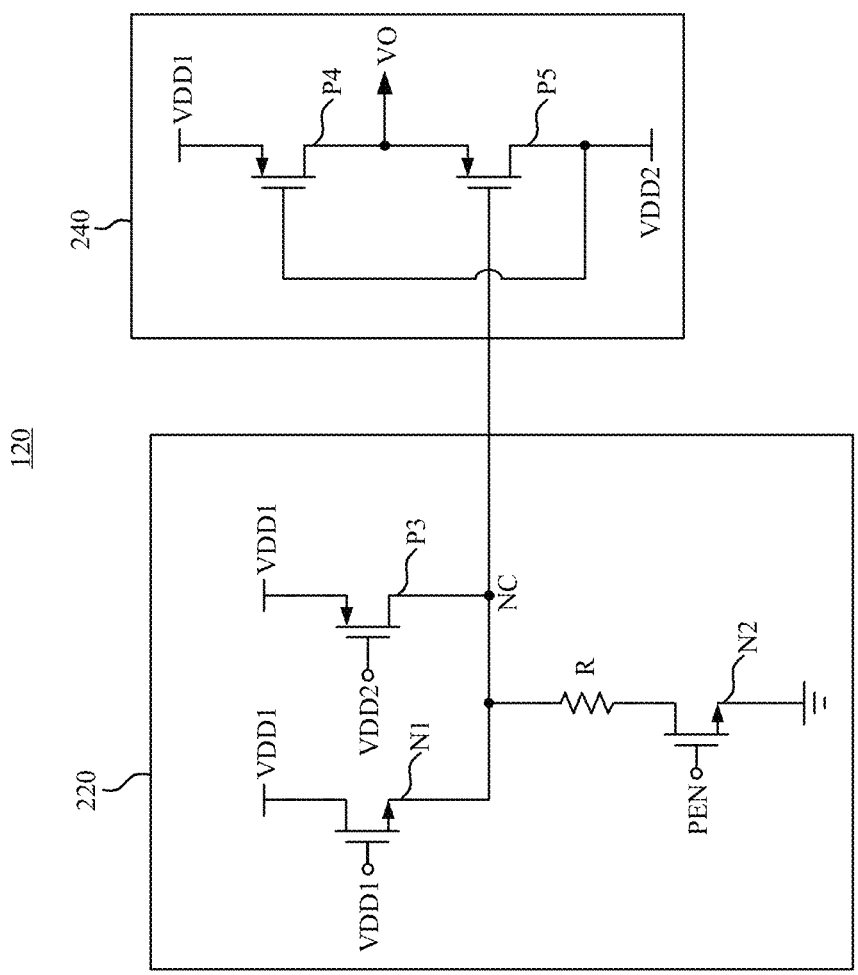
FIG. 2 illustrates a schematic diagram of the voltage selector device in FIG. 1 according to some embodiments of the present disclosure.

FIG. 2 illustrates a schematic diagram of the voltage selector device 120 in FIG. 1 according to some embodiments of the present disclosure. In some embodiments, the voltage selector device 120 includes a control circuit 220 and a selection circuit 240. The control circuit 220 is configured to adjust the level of a control node NC according to the power enable signal PEN, the supply voltage VDD1, and the supply voltage VDD2. For example, when the supply voltage VDD1 is powered up and the supply voltage VDD2 is not powered up, the control circuit 220 may adjust the control node NC to a first level. Alternatively, when the supply voltage VDD2 is powered up (regardless of whether the supply voltage VDD1 is powered up or not), the control circuit 220 may adjust the control node NC to a second level, which is different from the first level. For example, the second level may be lower than the first level.

In greater detail, the control circuit 220 includes transistors N1, P3, N2, and a resistor R. A first terminal (e.g., drain) and a control terminal (e.g., gate) of the transistor N1 receive the supply voltage VDD1, and a second terminal of transistor N1 (e.g., source) is coupled to the control node NC. A first terminal of the transistor P3 (e.g., source) receives the supply voltage VDD1, a second terminal of the transistor P3 (e.g., drain) is coupled to the control node NC, and a control terminal of the transistor P3 (e.g., gate) receives the supply voltage VDD2. The resistor R is coupled to the control node NC. A first terminal of transistor N2 is coupled through resistor R to the control node NC, a second terminal of transistor N2 is coupled to ground, and a control terminal of transistor N2 receives the power enable signal PEN. With the above arrangement, the transistor N1 may be selectively turned on according to the supply voltage VDD1 to adjust the level of the control node NC. The transistor P3 may be selectively turned on according to the supply voltage VDD1 and the supply voltage VDD2 to adjust the level of the control node NC. Similarly, the transistor N2 may be selectively turned on according to the power enable signal PEN to adjust the level of the control node NC. In some embodiments, when at least one of the supply voltage VDD1 and/or the supply voltage VDD2 is powered up, the power enable signal PEN has a high level, enabling transistor N2 to be turned on. In the aforementioned arrangements, the transistor N1 and the transistor N2 have the same conductivity type, and the transistor N1 and the transistor P3 have different types. For example, each of transistor N1 and transistor N2 is an N-type transistor, and transistor P3 is a P-type transistor, but the present disclosure is not limited thereto. Detailed operations of the control circuit 220 will be given later with reference to FIGS. 3A to 3C.

The selection circuit 240 is configured to output, based on the level of the control node NC and the supply voltage VDD2, a selected one of the supply voltages VDD1 and VDD2 that has a higher voltage level as the output voltage VO. In some embodiments, the selection circuit 240 may determine whether to output the supply voltage VDD1 as the output voltage VO according to the supply voltage VDD2, and determine whether to output the supply voltage VDD2 as the output voltage VO according to the level of the control node NC. In greater detail, the selection circuit 240 includes transistors P4 and P5. A first terminal of the transistor P4 receives the supply voltage VDD1, a second terminal of the transistor P4 generates the output voltage VO, and a control terminal of the transistor P4 receives the supply voltage VDD2. A first terminal of the transistor P5 is coupled to the second terminal of the transistor P4 and is configured to output the output voltage VO, a second terminal of the transistor P5 receives the supply voltage VDD2, and a control terminal of the transistor P5 is coupled to the control node NC. With the aforementioned arrangement, the transistor P4 may be selectively turned on according to the supply voltage VDD2 to output the supply voltage VDD1 as the output voltage VO, and the transistor P5 may be selectively turned on according to the level of the control node NC to output the supply voltage VDD2 as the output voltage VO. In the above arrangement, the transistors P4 and P5 have the same conductivity type. For example, both of the transistors P4 and P5 are P-type transistors, but the present disclosure is not limited thereto. Detailed operations of the selection circuit 240 will be given later with reference to FIGS. 3A to 3C.

Figure 3A:
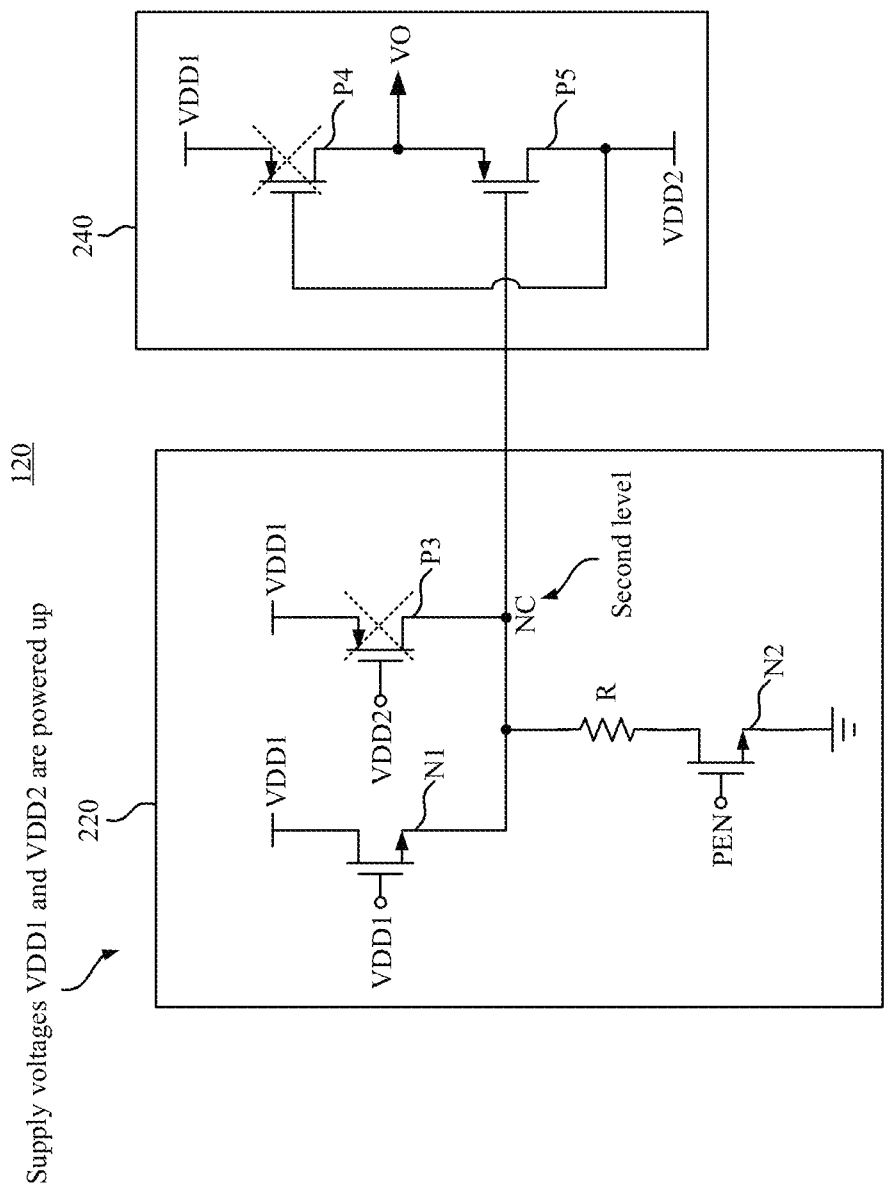
FIG. 3A illustrates a schematic diagram showing operations of the voltage selector device in FIG. 2 under a first scenario according to some embodiments of the present disclosure.

FIG. 3A illustrates a schematic diagram showing operations of the voltage selector device 120 in FIG. 2 under a first scenario according to some embodiments of the present disclosure. In the first scenario shown in FIG. 3A, both of the supply voltage VDD1 and the supply voltage VDD2 have been powered up. Under this condition, the power enable signal PEN is at a logic value of 1, causing the transistor N2 to be turned on. On the other hand, in response to the powered supply voltage VDD1 and supply voltage VDD2, the transistor N1 is turned on and transistor P3 is not turned on (indicated by a dashed line with symbol X). In some embodiments, the resistance value of the resistor R is set to a lower value, allowing the transistors N1 and P2 to pull the level of the control node NC down to a lower level (for example, the aforementioned second level). In response to this level of the control node NC and the powered supply voltage VDD2, the transistor P5 is turned on and outputs the supply voltage VDD2 as the output voltage VO. Additionally, in response to the powered supply voltage VDD1, the transistor P4 is not turned on.

Figure 3B:
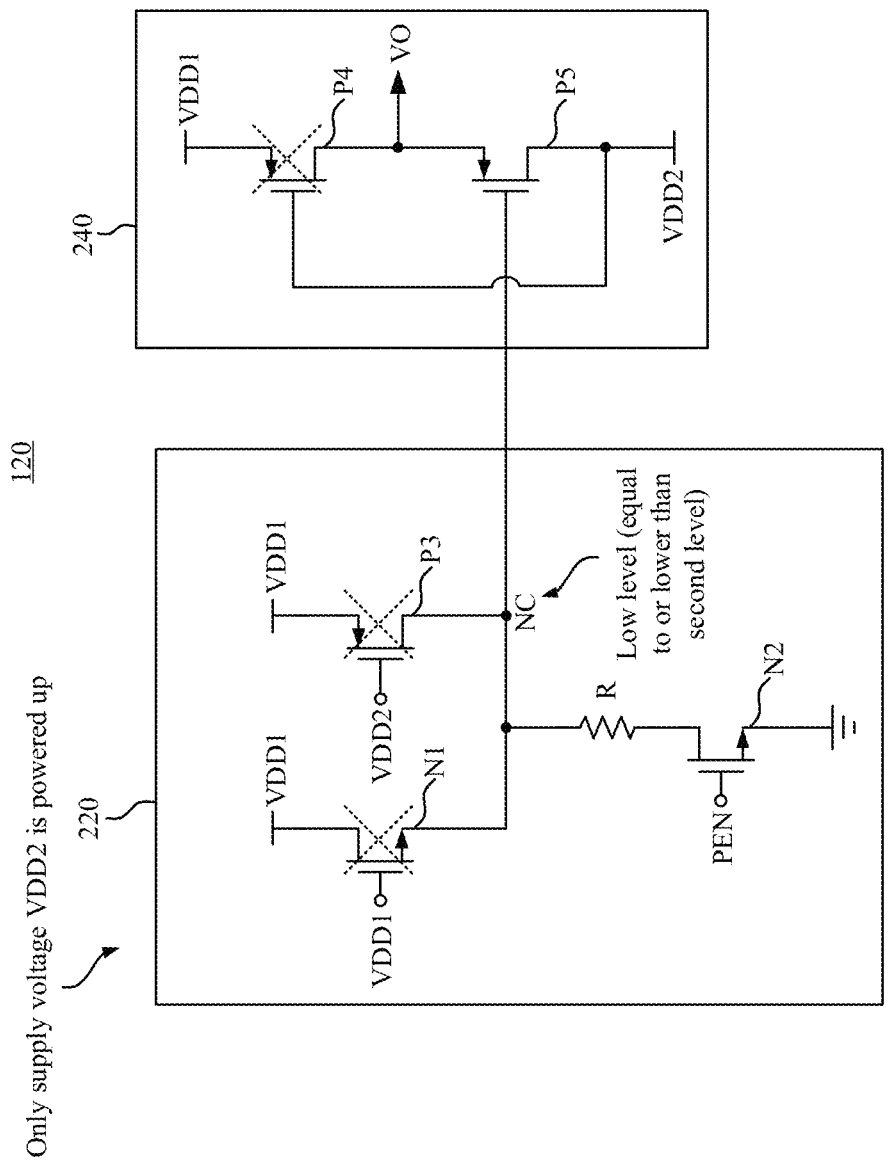
FIG. 3B illustrates a schematic diagram showing operations of the voltage selector device in FIG. 2 under a second scenario according to some embodiments of the present disclosure.

FIG. 3B illustrates a schematic diagram showing operations of the voltage selector device 120 in FIG. 2 under a second scenario according to some embodiments of the present disclosure. In the second scenario shown in FIG. 3B, the supply voltage VDD1 is not powered up (for example, at 0 volts) while only the supply voltage VDD2 is powered up. Under this condition, the power enable signal PEN is at a logic value of 1, causing the transistor N2 to be turned on. In response to the unpowered supply voltage VDD1 and the powered supply voltage VDD2, both of the transistor N1 and the transistor P3 are not turned on. Under these conditions, the level of the control node NC is pulled down to a low level (for example, equal to or lower than the aforementioned second level) by the transistor N2. In response to this level of the control node NC and the powered supply voltage VDD2, the transistor P5 is turned on and outputs the supply voltage VDD2 as the output voltage VO. Additionally, in response to the powered supply voltage VDD2 and the unpowered supply voltage VDD1, the transistor P4 is not turned on.

Figure 3C:
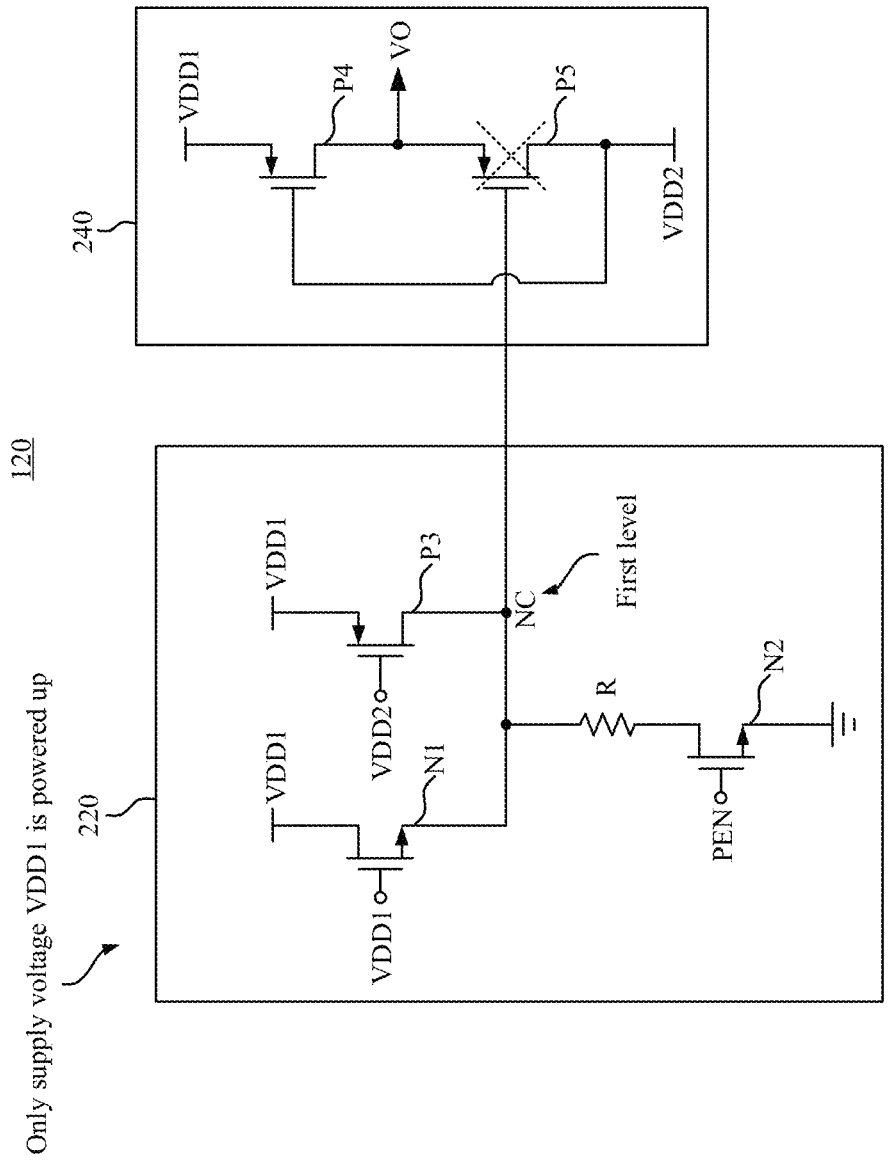
FIG. 3C illustrates a schematic diagram showing operations of the voltage selector device in FIG. 2 under a third scenario according to some embodiments of the present disclosure.

FIG. 3C illustrates a schematic diagram showing operations of the voltage selector device 120 in FIG. 2 under a third scenario according to some embodiments of the present disclosure. In the third scenario shown in FIG. 3C, the supply voltage VDD2 is not powered up (for example, at 0 volts) while only the supply voltage VDD1 is powered up. Under this condition, the power enable signal PEN is at the logic value of 1, causing the transistor N2 to be turned on. In response to the unpowered supply voltage VDD2 and the powered supply voltage VDD1, both of the transistor N1 and the transistor P3 are turned on. In other words, the transistors N1, N2, and P3 are all turned on under this condition, allowing the level of the control node NC to be pulled up to a higher level (for example, the aforementioned first level) by the transistor P3. In response to this level of the control node NC and the unpowered supply voltage VDD2, the transistor P5 is not turned on. Additionally, in response to the powered supply voltage VDD1 and the unpowered supply voltage VDD2, the transistor P4 is turned on and outputs the supply voltage VDD1 as the output voltage VO.

As shown in FIGS. 3A to 3C, in various voltage switching scenarios, when at least one of supply voltages VDD1 and/or VDD2 is powered up, the voltage selector device 120 may select the one of the supply voltages VDD1 and VDD2 that has a higher level and output the same as the output voltage VO. With such operations, it is able to continuously provide the correct base bias to the low-dropout regulator circuit 110 during the transient process of voltage switching, such that the clock generator circuit 140 is able to continuously output the clock signal CLK. As a result, digital circuitries that operate with the clock signal CLK can continue operating without interruption during the voltage switching process.

As described above, the voltage selector device provided in some embodiments of the present disclosure is able to automatically select one of supply voltages that has a higher level according to powered states of the supply voltages, in order to continuously provide the correct base bias. As a result, it is able to prevent system interruptions during the switching process of supply voltages.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A voltage selector device, comprising:
   a control circuit configured to adjust a level of a control node according to a power enable signal, a first supply voltage, and a second supply voltage, wherein when the first supply voltage is powered up and the second supply voltage is not powered up, the control circuit adjusts the level of the control node to a first level, and when the second supply voltage is powered up, the control circuit adjusts the level of the control node to a second level that is different from the first level; and
   a selection circuit configured to output, based on the level of the control node and the second supply voltage, a selected one of the first supply voltage and the second supply voltage that has a higher voltage level as an output voltage.

2. The voltage selector device of claim 1, wherein the control circuit comprises:
   a first transistor configured to be selectively turned on according to the first supply voltage to adjust the level of the control node;
   a second transistor configured to be selectively turned on according to the first supply voltage and the second supply voltage to adjust the level of the control node;
   a resistor coupled to the control node; and
   a third transistor coupled between the resistor and ground, and configured to be selectively turned on according to the power enable signal.

3. The voltage selector device of claim 2, wherein a first terminal and a control terminal of the first transistor receive the first supply voltage, and a second terminal of the first transistor is coupled to the control node.

4. The voltage selector device of claim 2, wherein a first terminal of the second transistor receives the first supply voltage, a second terminal of the second transistor is coupled to the control node, and a control terminal of the second transistor receives the second supply voltage.

5. The voltage selector device of claim 2, wherein the first transistor and the second transistor have different conductivity types.

6. The voltage selector device of claim 2, wherein when both of the first supply voltage and the second supply voltage are powered up, the second transistor is not turned on, and the first transistor and the third transistor are turned on to lower the level of the control node, such that the selection circuit outputs the second supply voltage as the output voltage, wherein the first supply voltage is lower than the second supply voltage.

7. The voltage selector device of claim 2, wherein when the second supply voltage is powered up, the first transistor and the second transistor are not turned on, and the third transistor is turned on to lower the level of the control node, such that the selection circuit outputs the second supply voltage as the output voltage.

8. The voltage selector device of claim 2, wherein when the first supply voltage is powered up and the second supply voltage is not powered up, the first transistor, the second transistor, and the third transistor are turned on to pull up the level of the control node, such that the selection circuit outputs the first supply voltage as the output voltage.

9. The voltage selector device of claim 2, wherein the first transistor and the third transistor have the same conductivity type.

10. The voltage selector device of claim 2, wherein each of the first transistor and the third transistor is an N-type transistor, and the second transistor is a P-type transistor.

11. The voltage selector device of claim 1, wherein the selection circuit is configured to determine whether to output the first supply voltage as the output voltage according to the second supply voltage, and determine whether to output the second supply voltage as the output voltage according to the level of the control node.

12. The voltage selector device of claim 1, wherein the selection circuit comprises:
   a first transistor configured to be selectively turned on according to the second supply voltage to output the first supply voltage as the output voltage; and
   a second transistor configured to be selectively turned on according to the level of the control node to output the second supply voltage as the output voltage.

13. The voltage selector device of claim 12, wherein a first terminal of the first transistor receives the first supply voltage, a second terminal of the first transistor is coupled to the second transistor and is configured to output the output voltage, and a control terminal of the first transistor receives the second supply voltage.

14. The voltage selector device of claim 12, wherein a first terminal of the second transistor is coupled to the first transistor and is configured to output the output voltage, a second terminal of the second transistor receives the second supply voltage, and a control terminal of the second transistor is coupled to the control node.

15. The voltage selector device of claim 12, wherein the first transistor and the second transistor have the same conductivity type.

16. The voltage selector device of claim 1, wherein the output voltage is configured to bias a base of each of P-type transistors in a low-dropout regulator circuit.

17. The voltage selector device of claim 16, wherein the low-dropout regulator circuit is configured to supply power to a clock generator circuit.

* * * * *